(12) United States Patent
Bicknell et al.

(10) Patent No.: US 7,639,903 B2
(45) Date of Patent: Dec. 29, 2009

(54) DAISY CHAIN OPTICAL INTERCONNECT

(75) Inventors: Robert Newton Bicknell, Corvallis, OR (US); Pavel Kornilovich, Corvallis, OR (US); Jong-Souk Yeo, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/974,711

(22) Filed: Oct. 15, 2007

(65) Prior Publication Data

US 2009/0097213 A1    Apr. 16, 2009

(51) Int. Cl.
*G02B 6/43* (2006.01)
*G02B 6/26* (2006.01)
*G02B 6/42* (2006.01)
*H05K 1/02* (2006.01)

(52) U.S. Cl. .................... 385/14; 385/17; 385/46; 361/752; 361/803

(58) Field of Classification Search .............. 385/14, 385/15, 17, 46; 361/752, 803
See application file for complete search history.

(56) References Cited

U.S. PATENT DOCUMENTS

| 4,943,136 | A | 7/1990 | Popoff |
| 5,995,512 | A | 11/1999 | Pogue, Jr. |
| 6,160,653 | A | 12/2000 | Davidson |
| 6,208,779 | B1 | 3/2001 | Rowlette, Sr. et al. |
| 6,243,510 | B1* | 6/2001 | Rauch ................... 385/15 |
| 6,661,940 | B2* | 12/2003 | Kim ..................... 385/15 |
| 6,755,573 | B2 | 6/2004 | Hoffmann et al. |
| 7,102,893 | B1* | 9/2006 | MacArthur et al. ........ 361/788 |
| 2003/0210869 | A1* | 11/2003 | Doorn ................... 385/53 |

* cited by examiner

*Primary Examiner*—Daniel Petkovsek

(57) ABSTRACT

A daisy-chain optical interconnection technique provides connectivity among a plurality of circuit boards. A plurality of optical cables is connected between pairs of the circuit boards to form a ring. Optical connection matrices disposed on each circuit board accept the ends of the optical cables. The optical connection matrices include optical vias to connect selected ones of the optical paths between ends of the optical cables. Unselected ones of the optical paths are coupled to optical transmitters and optical receivers on each board.

15 Claims, 6 Drawing Sheets

DAISY CHAIN OPTICAL INTERCONNECT

BACKGROUND

Electronics systems, such as servers, typically include a number of printed circuit boards placed into a card cage or rack. A backplane is used to provide electrical interconnection between the circuit boards, and the circuit boards include connectors that mate into corresponding connectors of the backplane. Data can accordingly be transferred between circuit boards over the backplane via electrical signals.

As data bandwidths between circuit cards have increased, many difficulties with providing data transfer over a backplane have arisen. As data rates are increased, electromagnetic interference and crosstalk can become a problem, making the backplane design more difficult and expensive. Non-ideal characteristics presented by electrical connectors also prove increasingly problematic as data rates are increased.

Increasing numbers of parallel interconnections can be used to provide bandwidth increases, but this leads to increased pin and component counts as well as higher power consumption. Very large backplane connectors can also result in high insertion forces and reduced reliability.

Sometimes, auxiliary connections between boards have been used in addition to the backplane connections, including for example ribbon cables between connectors disposed on board front edges (the edges opposite the backplane). Of course, these auxiliary connections also face similar electrical design challenges as the backplane with respect to signal quality, electromagnetic interference, and other problems.

Increasingly, systems designers are turning to optical interconnect as an alternative to conventional electronic interconnects. Optical interconnects provide the potential for very high bandwidths while providing generally less electromagnetic interference generation and susceptibility than electrical interconnects.

While optical backplanes have been proposed, optical backplanes tend to be complex and expensive. In part, expense results from the difficulty of providing alignment of optical inputs and outputs from the boards to the backplane. In part, this difficulty results from relatively low tolerance mechanical structures used in card cages. While electrical connectors are designed to accommodate these tolerances, providing the higher alignment desired in optical connectors can add significant cost and mechanical complexity to the card cage and connectors.

Optical interconnection can use optical cables connected between boards. Unfortunately, large numbers of optical cables are often used to provide interconnections between many different pairs of circuit boards adding costs to the system.

BRIEF DESCRIPTION OF THE DRAWINGS

Features and advantages of the invention will be apparent from the detailed description which follows, taken in conjunction with the accompanying drawings which together illustrate, by way of example, features of the invention; and, wherein.

DETAILED DESCRIPTION OF EXAMPLE EMBODIMENTS

In describing embodiments of the present invention, the following terminology will be used.

The singular forms "a," "an," and "the" include plural referents unless the context clearly dictates otherwise. Thus, for example, reference to "a component surface" includes reference to one or more of such surfaces.

As used herein, the term "about" means that dimensions, sizes, formulations, parameters, shapes and other quantities and characteristics are not and need not be exact, but may be approximated and/or larger or smaller, as desired, reflecting tolerances, conversion factors, rounding off, measurement error and the like and other factors known to those of skill in the art.

Reference will now be made to the exemplary embodiments illustrated, and specific language will be used herein to describe the same. It will nevertheless be understood that no limitation of the scope of the invention is thereby intended.

Figure 1:
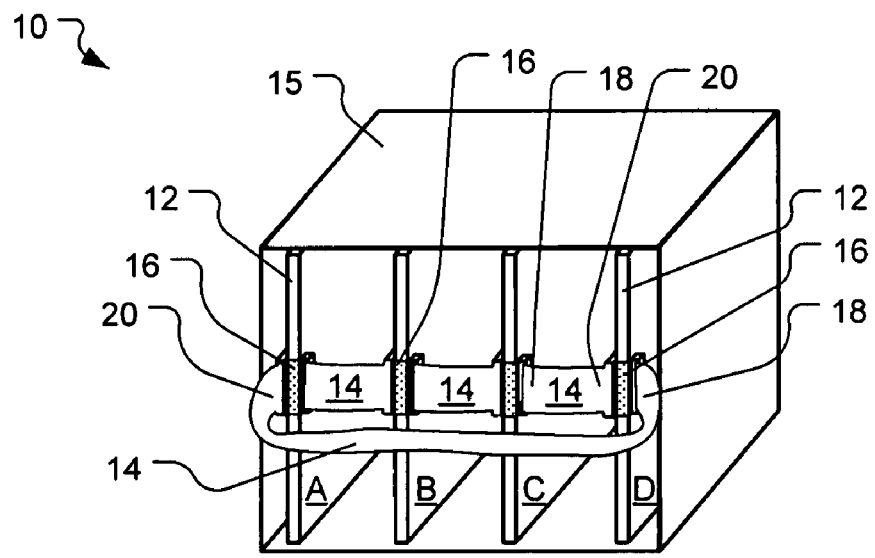
FIG. 1 is a front view illustration of an electronic system incorporating a daisy-chain optical interconnect in accordance with an embodiment of the present invention.

FIG. 1 illustrates an electronic system in accordance with an embodiment of the present invention. The electronic system 10 includes a plurality of circuit boards 12. For example, as illustrated here, the system includes four boards labeled A through D, although it will be appreciated than other numbers of circuit boards can be interconnected using the techniques described herein. A plurality of optical cables 14 is connected between the circuit boards, each optical cable connecting an adjacent pair of the circuit boards to form a daisy-chain ring (in a linear arrangement as shown in FIG. 1, the end boards are considered to be adjacent).

The optical cables 14 each include a plurality of optical paths. The optical paths may be, for example fiber optics within a bundled cable or a ribbon cable, or other optical waveguide structures. In general, a system having N circuit boards 12 can use N optical cables 14 to connect the circuit boards into a daisy-chain ring, wherein each optical cable has at least N*(N−1)/2 optical paths. The circuit boards may be installed in a card cage 15. While the boards are shown here mounted vertically within in a card cage, the boards may be installed in other arrangements, including for example horizontal configurations, angled configurations, ring configurations, and other variations.

The daisy-chain arrangement can provide for full-mesh connectivity as will now be explained. Each circuit board 12 has disposed thereon an optical matrix 16 which receives the ends 18, 20 of the optical cables 14. The optical matrix includes a mixture of pass through ports and terminated optical ports. The pass through ports include optical vias that provide optical coupling between selected optical paths within the optical cables, passing through the circuit board. In other words, the optical path is not interrupted by the circuit board. The optical terminations provide input and output optical signals (e.g., from optical transmitters and optical receivers as described further below) to unselected optical paths within the optical cables. Pass through ports allow for optical communications to bypass a circuit board (e.g., providing next neighbor communications), while terminated ports allow for communication to and from a circuit board.

Figure 2:
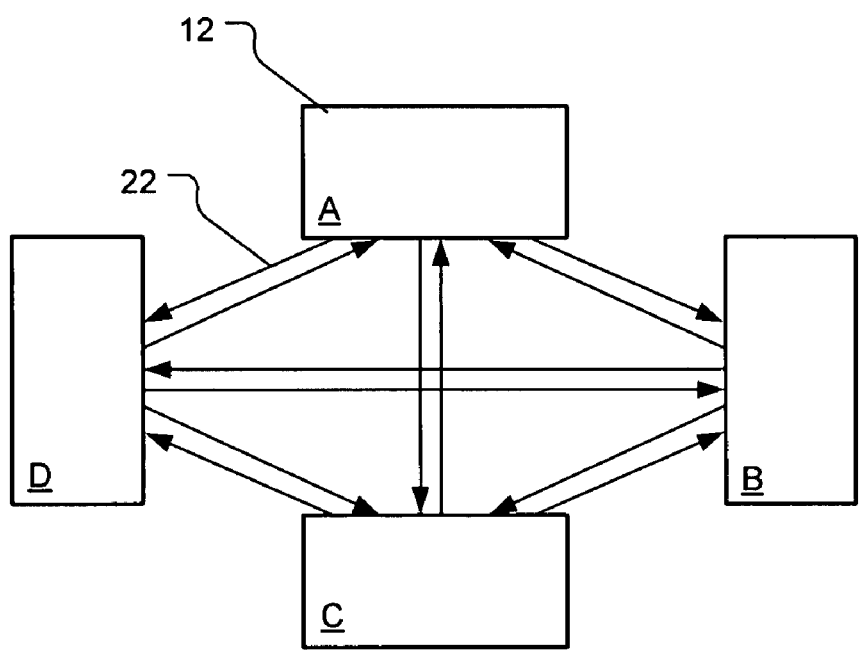
FIG. 2 is a functional diagram showing an example of full-mesh connectivity between a plurality (N=4) of circuit boards in accordance with an embodiment of the present invention.

FIG. 2 provides a functional illustration of full-mesh connectivity for the system of FIG. 1, showing the optical communications 22 provided between the boards. Each board has six communications paths to other boards. In general, for a system of N boards, each board has 2*(N−1) communications paths to the other boards (half incoming, half outgoing connections). A total of N*(N−1) optical connections are therefore used per board.

Rather than directly implementing an optical cable for each of the optical communications 22, the optical communications are daisy chained through the optical matrices 16 on the boards. This allows fewer optical cables to be used, as the optical paths within the optical cables are interrupted at certain boards to provide input and output to the boards.

Figure 3:
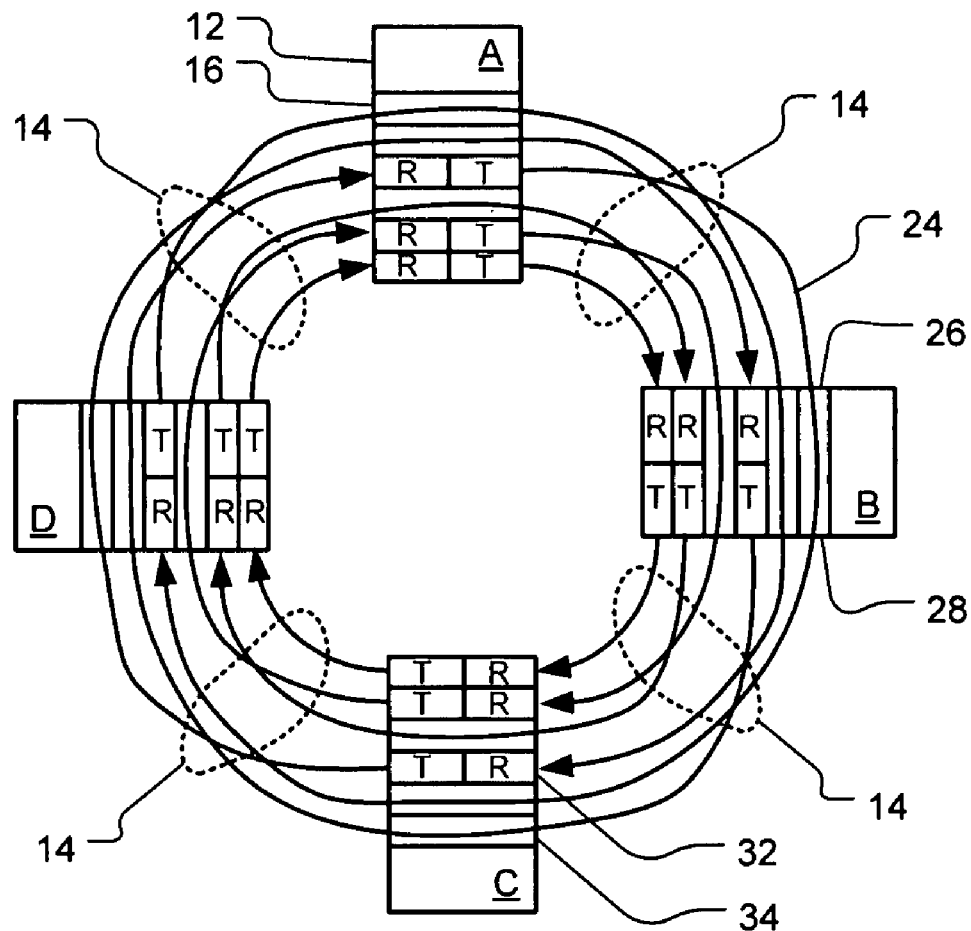
FIG. 3 is a block diagram showing a daisy-chain arrangement of optical interconnections to provide full-mesh connectivity in accordance with an embodiment of the present invention for a system having four boards.

FIG. 3 shows a block diagram illustrating the arrangement of optical paths 24 within the optical cables 14 for the system of N=4 cables. The optical matrices 16 of the boards 12 are labeled A through D, corresponding to the boards A through D, and are all identical. The four optical cables 14 each have six optical paths.

Considering an optical matrix 16 in detail, it has an input side 26 and an output side 28, and includes six ports. The ports are of two types: terminated ports 32 and pass through ports 34. Pass through ports include an optical via, providing optical communication from the input side (e.g., an optical path 24 of a first optical cable) to the output side (e.g., an optical path of a second optical cable). The terminated ports provide optical interface to an optical transmitter T and an optical receiver R, which may be mounted to the optical matrix or to the circuit board 12. For example, at the input side, the terminated port interfaces to an optical receiver, and at the output side, the terminated port interfaces to an optical transmitter.

With reference to the ring arrangement of FIG. 3, the innermost optical paths 24 provide communications one board over (i.e., A to B, B to C, C to D, and D to A) in a clockwise direction. For example, data sources at an optical transmitter on board A are passed to an optical receiver on board B. The next two optical paths skip over one board using an optical pass through, and thus provides communications to a board two boards away (i.e., A to C, B to D, C to A, and D to B). The outermost group of three optical paths skip over two boards (through two optical pass throughs), providing connectivity to a board three boards away in a clockwise direction (which is the neighboring board in the counter-clockwise direction, i.e. A to D, B to A, C to B, D to C).

The optical paths 24 within the optical cables 14 are permuted in a regular pattern. In general, for a system having N circuit boards, the optical cables include N*(N−1)/2 optical paths. The optical paths within the optical cables can be grouped into N−1 groups. Labeling the groups #1 through #(N−1), each group contains a number of optical paths equal to its group number. Note that $1+2+3+\ldots+(N-1)=N*(N-1)/2$. The optical paths are permuted within each group using a circular shift.

The circular shift can be described as follows. For a group of m optical paths connecting port numbers i through i+m−1, port j at the input end of the cable is connected to port j+1 at the output end of the cable, for j=i ... m−2 and port i+m−1 at the input end of the cable is connected to port i at the output end of the cable.

In table form, the connections for group m starting at port i, the connections are:

TABLE 1

Permutations of Optical Paths

| Input Port | Output Port |
|---|---|
| i | i + 1 |
| i + 1 | i + 2 |
| i + 2 | i + 3 |
| . | . |
| . | . |
| i + m − 2 | i + m − 1 |
| i + m − 1 | i |

The starting port number for group m is given by $m*(m-1)/2+1$, or the sequence $\{1, 2, 4, 7, 11, 16 \ldots\}$.

For the optical matrices, the first port in each group is terminated, while the remaining ports are pass through ports. Accordingly, the optical connection matrix includes N−1 terminated ports (optically coupling to N−1 optical transmitters and N−1 optical receivers). The remaining (N−2)*(N−1)/2 ports are optical pass through ports. By using a common connector port pattern, the optical cables can all have the identical permutation arrangement as described above, simplifying the overall architecture of the system.

Table 2 below provides a summary of optical port assignments for various numbers of circuit boards. In reading Table 2, for a given number of boards, the pin assignments are cumulative. For example, for a six board system, the port assignments include the assignments listed under the six board system plus all of the assignments for systems with a smaller number of boards. This provides a benefit in that scalability of the system can be provided.

TABLE 2

Port Assignments as a Function of System Size

| # of Boards | # of Optical Paths | Port Number | Port Type | Function |
|---|---|---|---|---|
| 2 | 1 | 1 | terminated | to/from $1^{st}$ neighbor |
| 3 | 3 | 2 | terminated | to/from $2^{nd}$ neighbor |
|   |   | 3 | pass through |   |
| 4 | 6 | 4 | terminated | to/from $3^{rd}$ neighbor |
|   |   | 5 | pass through |   |
|   |   | 6 | pass through |   |
| 5 | 10 | 7 | terminated | to/from $4^{th}$ neighbor |
|   |   | 8 | pass through |   |
|   |   | 9 | pass through |   |
|   |   | 10 | pass through |   |
| 6 | 15 | 11 | terminated | to/from $5^{th}$ neighbor |
|   |   | 12 | pass through |   |
|   |   | 13 | pass through |   |
|   |   | 14 | pass through |   |
|   |   | 15 | pass through |   |

While connections for systems of up to six boards are shown in Table 2, the invention is not so limited. Larger systems may be accommodated, although the number of optical paths increases according to a square law, thus using increasingly larger numbers of optical paths. Optical fiber bundle cables are available having hundreds of optical fibers, enabling the daisy-chain interconnection of systems having up to about twenty circuit boards, although larger size cables can enable interconnection of larger numbers of circuit boards. As particular examples, the daisy chain optical interconnection can be provided for a system having a number of boards greater than two, a number of boards up to and including twenty circuit boards, a system having a number of boards within the range of five to twenty circuit boards, as well as other numbers and ranges.

Figure 4:
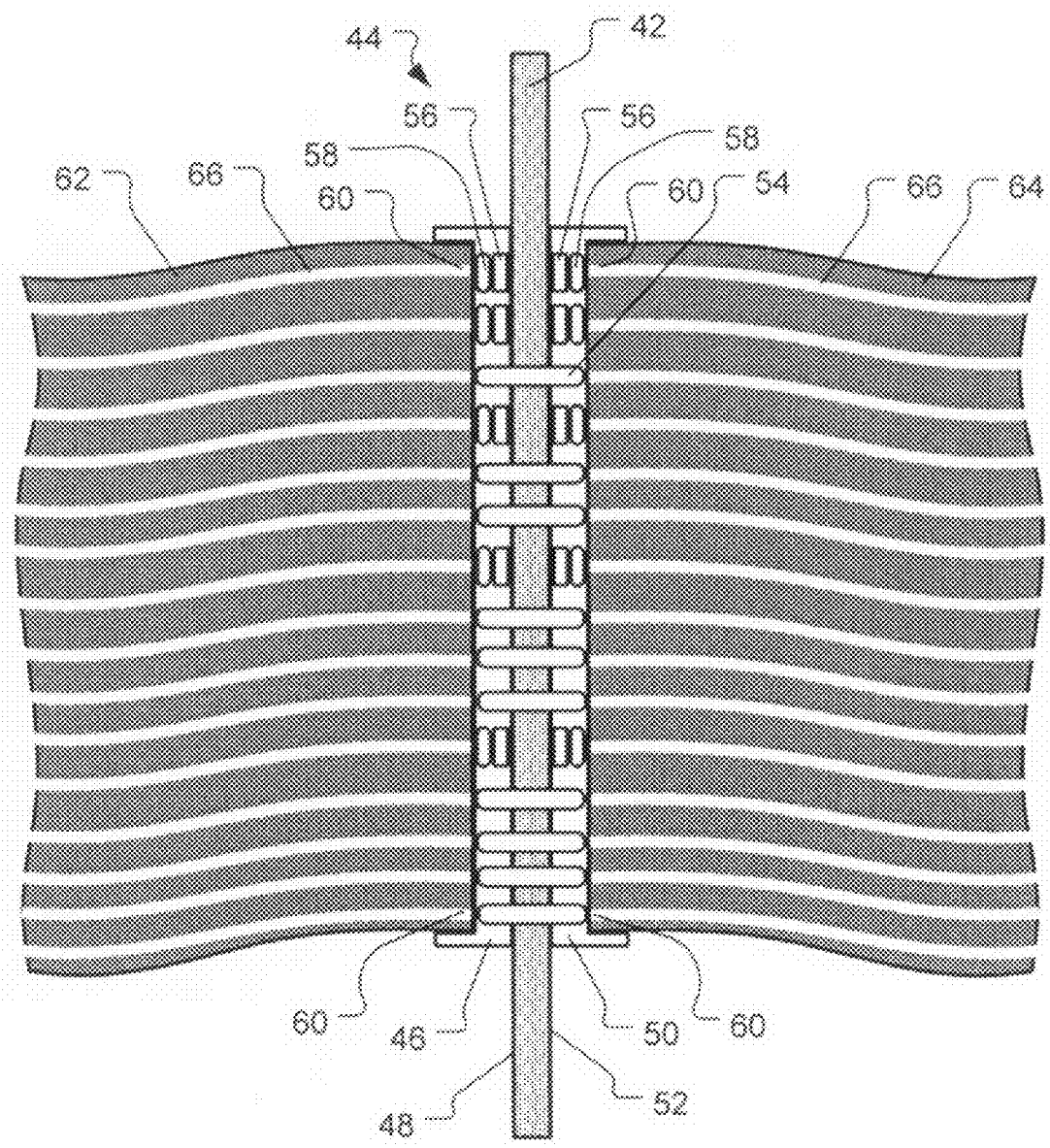
FIG. 4 is a cross-sectional view illustration of a circuit board having an optical matrix designed for providing connectivity in a six-board interconnection in accordance with an embodiment of the present invention.

FIG. 4 illustrates a cross section of a circuit board 42 having an optical matrix disposed thereon 44 in accordance with an embodiment of the present invention. The optical matrix provides for interconnection among six circuit boards. The optical matrix includes a first optical connector 46 disposed on a first side 48 of the circuit board and configured to receive the end of a first optical cable 62. The optical matrix also includes a second optical connector 50 disposed on a second side 52 of the circuit board and configured to receive the end of a second optical cable 64. The connectors each define a plurality of optical ports 60. The optical cables include a plurality of optical paths 66, for example, fiber optics or optical waveguides. The optical ports of the connectors correspond to ends of the optical paths of the optical cables, allowing light to be coupled into or out of the ends of the optical paths.

The optical matrix 44 includes a plurality of optical vias 54. The vias provide optical coupling between the ends 60 of the optical paths 66 of the first optical cable 62 and the second optical cable 64. The vias may include, for example, microlenses, graded index lenses, or the like.

The optical matrix 44 also includes a plurality of optical transducers 56. The optical transducers convert between an optical signal and an electrical signal. The optical transducers may be optical transmitters or optical receivers. Optical transmitters include, for example, vertical cavity surface emitting lasers (VCSELs), light emitting diodes (LEDs) and the like. Optical receivers include, for example, photodiodes and phototransistors.

Each optical transducer 56 is in optical communication with an optical path 66 of the optical cables 62, 64. For example, coupling optics 58 may be interposed between the optical transducers and the optical paths of the optical cable. Coupling optics may include, for example, microlenses or gradient index lenses. Optical transmitters may be disposed at input ends of the optical paths 66 and optical receivers may be disposed at output ends of the optical paths.

Optical transmitters may be placed on one side (e.g., the first side 48) of the optical matrix 44 to define a plurality of optical output ports, and optical receivers can be placed on the other side (e.g., the second side 52) to define a plurality of optical input ports. Such an arrangement provides a common direction of optical signal flow through the optical cables 62, 64 and optical matrix 44. The invention is not so limited, however, as different optical signal paths may pass optical signals in different directions.

The optical cables 62, 64 may include permutations in the optical paths to provide the full-mesh connectivity, as described above, allowing the optical matrices on each board to be identical in the arrangement of the ports. This allows the use of optical connectors on each of the boards having the same footprint. Footprint refers to the spatial arrangement of the ports on the connector face. More particularly, when the port arrangement of the connectors is viewed from the mating side, the first optical connectors 46 on all of the boards 42 may have a common port arrangement, and the second optical connectors 50 may have the mirror image of the common port arrangement.

Figure 5:
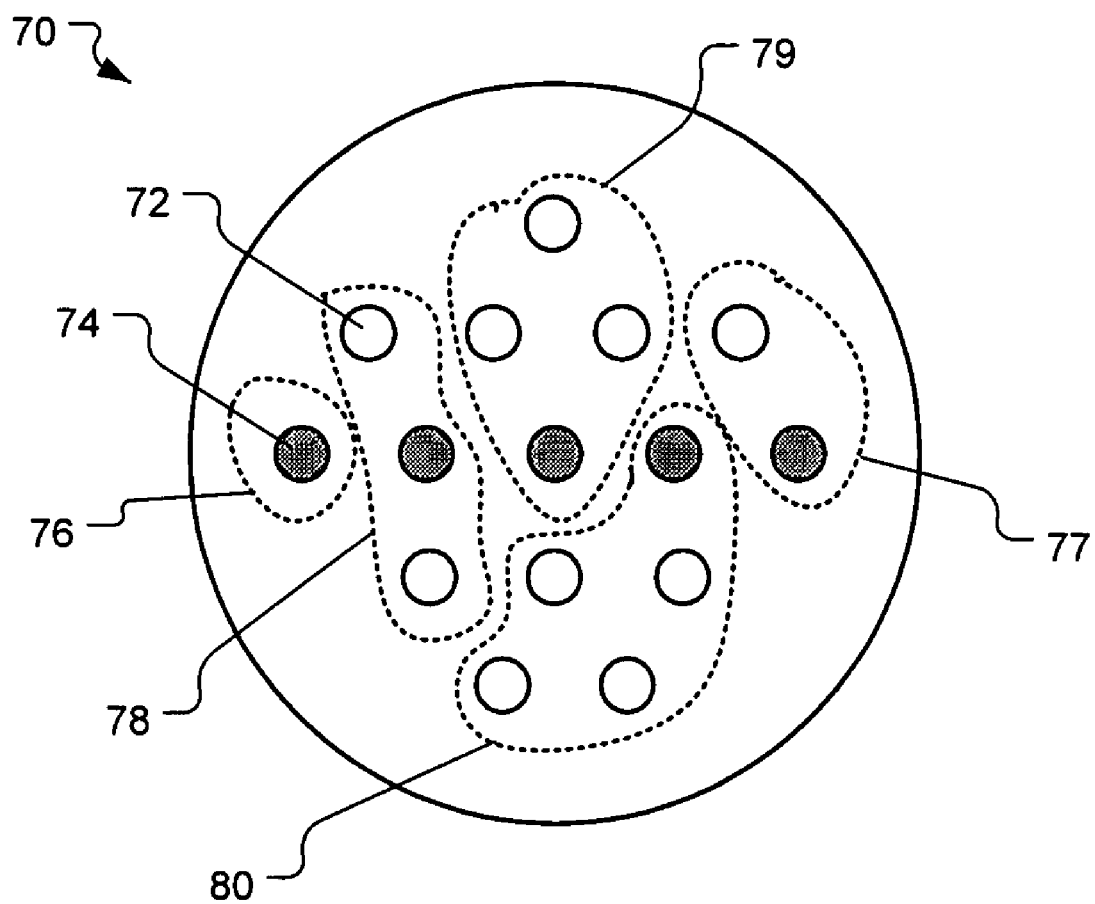
FIG. 5 is a front view illustration of an optical connector for a six-board interconnection in accordance with another embodiment of the present invention.

Although the connectors in FIG. 4 are illustrated in a linear arrangement (e.g., a rectangular or square connector), various other connector arrangements can be used. For example, FIG. 5 illustrates one arrangement of an optical connector 70 for a six-board system, showing pass through ports 72 as open circles and terminated ports 74 as shaded circles. Dotted lines show the various groups of connections providing communication between neighboring circuit boards (group 76), second nearest neighbors (group 77), third nearest neighbors (group 78), fourth nearest neighbors (group 79) and fifth nearest neighbors (group 80). Other arrangements of connectors and groups can be used as well.

Figure 6:
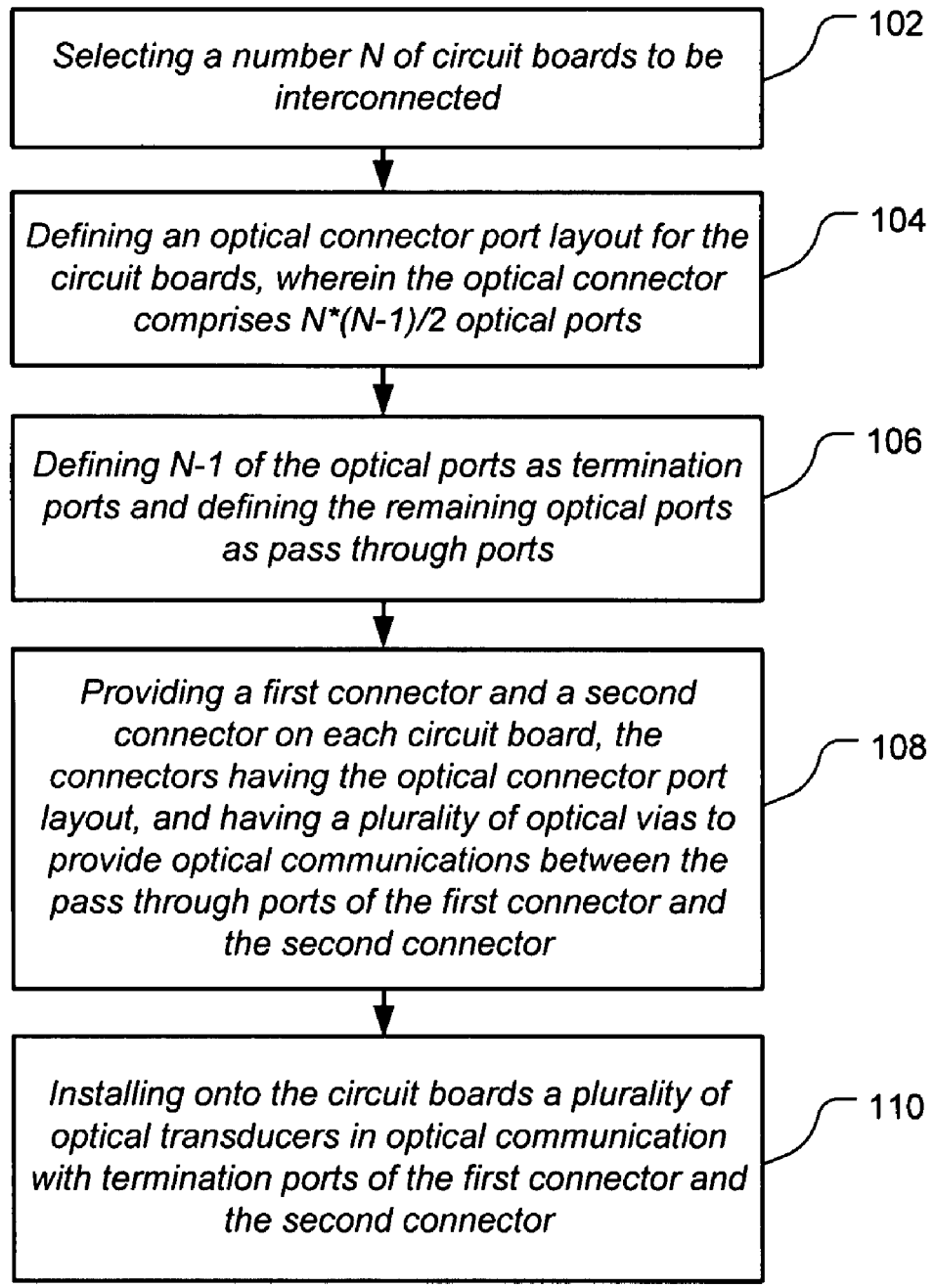
FIG. 6 is flow chart of a method of providing daisy-chain optical interconnections within an electronic system in accordance with an embodiment of the present invention.

A method of providing optical daisy-chain interconnection within an electronic system will now be described in conjunction with the flow chart of FIG. 6. The method 100 may include selecting 102 a number N of circuit boards to be interconnected. Another operation may include defining 104 an optical connector port layout for the circuit boards. The optical connector may include $N*(N-1)/2$ optical ports, for example, as described above. Also, the method can include defining 106 $N-1$ of the optical ports as terminated ports and the remaining optical ports as pass through ports, for example as described above.

The method 100 may further include providing 108 a first connector and a second connector on each circuit board, wherein the connectors have the optical connector port layout. A plurality of vias can be disposed between the connectors to provide optical communications between the pass through ports of the first connector and the second connector.

Another operation of the method 100 can be installing 110 a plurality of optical transducers onto the circuit boards, wherein the optical transducers are in optical communication with the termination ports of the first connector and the second connector, for example as described above.

If desired, the circuit boards may be installed into a card cage, and a plurality of optical cables installed to provide pair-wise connections between the circuit boards. As described above, the optical cables can provide a full-mesh optical interconnection among the plurality of circuit boards.

Figure 7:
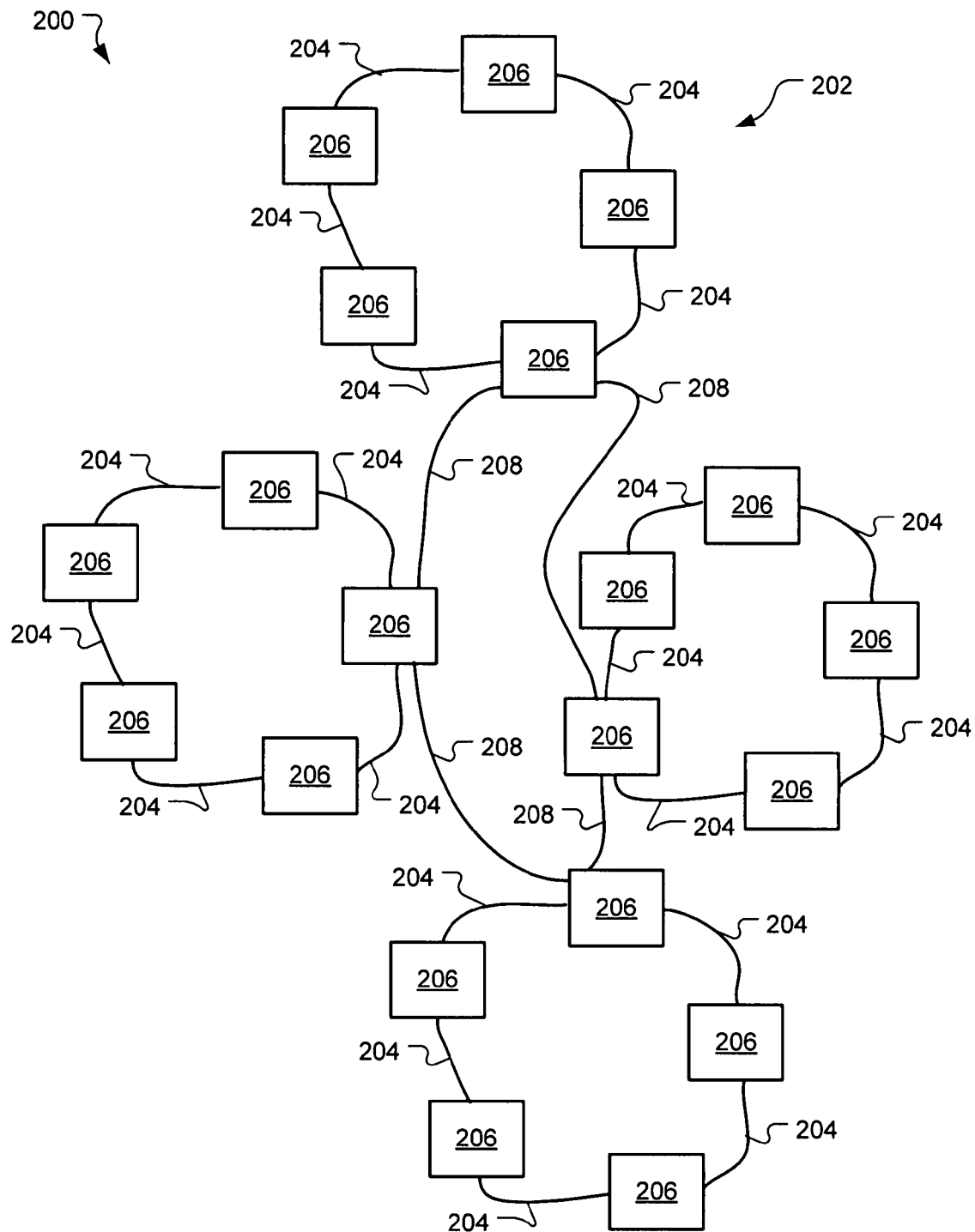
FIG. 7 is a block diagram illustration of a system having twenty boards, wherein various subsets of the boards are interconnected using optical cables in accordance with an embodiment of the present invention.

If desired, partially interconnected meshes of boards may also be formed. For example, in a system having a large number of boards, providing a fully interconnected mesh may use a very large number of optical paths. Accordingly, different sets of boards within the system may be interconnected. For example, FIG. 7 illustrates a system 200 of twenty boards, where four groups 202 of five boards 206 each are interconnected using first optical cables 204. For example, the first optical cables may provide a fully interconnected mesh for each of the groups as described above. Second optical cables 208 may connect one board from each group into a second interconnected mesh. Accordingly, the system of twenty boards provides an interconnection mesh, where various subsets of the boards are fully interconnected.

Various other similar arrangements of partially interconnected boards as shown in FIG. 7 may be used. Interconnections using optical cables as described herein may also be combined with other well-known interconnection schemes, such as free-space optical links, point to point optical links, electrical interconnections (e.g., through cables or a backplane). As another example, the optical cable may include electrical contacts and electrical path to augment the optical paths with electrical paths.

Summarizing and reiterating to some extent, daisy-chain optical interconnection in accordance with embodiments of the present invention helps to provide optical interconnectivity within an electronic system, while reducing the number of interconnect cables used. The interconnect cables include a number of optical paths. A subset of the optical paths are interrupted at each circuit board and terminated by optical transmitters and receivers. Other optical paths are passed through each circuit board, allowing optical connections to be made between non-adjacent boards.

The optical interconnections can use a common connector footprint. With such an arrangement, a regular pattern is established, so that each circuit board knows which transmitters and receiver transmit to other circuit boards. This helps to simplify the communications architecture, as dynamic routing of optical data can be avoided.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. An electronic system providing daisy-chain optical interconnection among a plurality of circuit boards comprising:
   a plurality of circuit boards;
   a plurality of optical cables, each optical cable connected between a pair of the plurality of circuit boards to form a daisy-chain ring, each optical cable having a first end and a second end and a plurality of optical paths between the first end and the second end; and
   an optical connection matrix disposed on each circuit board, the optical connection matrix comprising:
      a plurality of optical vias to connect selected optical paths from the first end of a first optical cable to the second end of a second optical cable,
      a plurality of optical transmitters optically coupled to unselected optical paths at the first end of the first optical cable,
      a plurality of optical receivers optically coupled to unselected optical paths at the second end of the second optical cable, and
      wherein the optical paths provide a plurality of optical interconnections among the circuit boards.

2. The electronic system of claim 1, wherein the optical paths provide full-mesh optical connectivity among the circuit boards.

3. The electronic system of claim 1, wherein:
   the plurality of circuit boards comprises N circuit boards;
   the plurality of optical cables comprises N optical cables;
   each one of the plurality of optical cables comprises at least N*(N−1)/2 optical paths disposed within the optical cables; and
   the optical connection matrix comprises at least (N−2)*(N−1)/2 optical vias, at least N−1 optical transmitters, and at least N−1 optical receivers.

4. The electronic system of claim 1, wherein N is less than or equal to 20.

5. The electronic system of claim 1, wherein N is within the range of 5 to 20.

6. The electronic system of claim 1, wherein the optical vias on each of the circuit boards are disposed in same positions relative to each other.

7. The electronic system of claim 1, wherein the circuit boards each comprise:
   a first optical connector configured to receive a first end of one of the optical cables and optically interface the plurality of optical paths to the optical vias and the plurality of optical transmitters on the circuit board, wherein the first optical connector optically coupled to the optical connection matrix; and
   a second optical connector configured to receive a second end of one of the optical cables and optically interface the plurality of optical paths to the plurality of optical vias and the plurality of optical receivers on the circuit board, wherein the second optical connector optically coupled to the optical connection matrix.

8. The electronic system of claim 7, wherein the first optical connector on each of the circuit boards uses the same footprint.

9. The electronic system of claim 1, further comprising:
   a plurality of optical coupling elements interposed between the plurality of optical transmitters and corresponding unselected optical paths at the first end of the first optical cable.

10. The electronic system of claim 1, further comprising:
    a plurality of optical coupling elements interposed between the plurality of optical receivers and corresponding unselected optical paths at the second end of the first optical cable.

11. The electronic system of claim 1, wherein the optical cables permute the optical paths within the optical cable according to a predetermined pattern.

12. The electronic system of claim 1, wherein each optical cable comprises a total of N*(N−1)/2 optical paths, wherein N is a number of circuit boards, and the optical paths are grouped into N groups, the groups being numbered from m=1 ... N, wherein group number m has m optical paths, and the optical paths within each group are circularly permuted between the first end and the second end of the optical cable.

13. The electronic system of claim 1, wherein the optical cables comprise a plurality of fiber optic strands.

14. The electronic system of claim 1, wherein the optical cables comprise a fiber optic ribbon cable.

15. The electronic system of claim 1, wherein the plurality of circuit boards are installed in a card cage.

* * * * *